(12) United States Patent  
Klenk et al.

(10) Patent No.: US 11,050,327 B2  
(45) Date of Patent: Jun. 29, 2021

(54) MOTOR ASSEMBLY

(71) Applicant: STEERING SOLUTIONS IP HOLDING CORPORATION, Saginaw, MI (US)

(72) Inventors: Daniel J. Klenk, Saginaw, MI (US); Michael J. Srda, Birch Run, MI (US); Ryan D. Yaklin, Chesaning, MI (US); Chuck Worner, Freeland, MI (US); Neal R. Roller, Essexville, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 167 days.

(21) Appl. No.: 16/380,692

(22) Filed: Apr. 10, 2019

(65) Prior Publication Data

US 2020/0328659 A1    Oct. 15, 2020

(51) Int. Cl.
*H02K 11/33*    (2016.01)
*H05K 7/20*     (2006.01)
*B62D 5/04*     (2006.01)

(52) U.S. Cl.
CPC ............ *H02K 11/33* (2016.01); *B62D 5/0406* (2013.01); *H05K 7/209* (2013.01)

(58) Field of Classification Search
CPC .......... H02K 11/30; H02K 5/18; B60W 30/12; B62D 5/005
USPC ................................. 310/68 B, 71; 180/446
See application file for complete search history.

(56) References Cited

U.S. PATENT DOCUMENTS

| | | | |
|---|---|---|---|
| 6,394,218 B1 * | 5/2002 | Heitzer | B62D 5/003 180/402 |
| 2006/0108884 A1 * | 5/2006 | Shiino | B60T 8/267 310/89 |
| 2019/0210636 A1 * | 7/2019 | Hamada | H02K 5/225 |
| 2020/0251966 A1 * | 8/2020 | Endo | H02P 27/06 |

* cited by examiner

*Primary Examiner* — Jose A Gonzalez Quinones
(74) *Attorney, Agent, or Firm* — Dickinson Wright PLLC

(57) ABSTRACT

A motor assembly includes a motor, an outward electronic control unit (ECU), an inward ECU, and a motor sensor board unit. The inward ECU is disposed between the motor and the outward ECU. The motor sensor board unit is disposed between the motor and the inward ECU, and is attached to the inward ECU.

19 Claims, 4 Drawing Sheets

MOTOR ASSEMBLY

BACKGROUND

The present disclosure relates to a motor assembly, and more particularly, to a steering motor assembly with a stackable motor control assembly.

Motor assemblies are known to include both a motor and a motor control assembly as one package. In some applications, the motor control assembly may include two independent motor controllers in hopes of improving control reliability should one controller fail. The cause of controller failure, however, may effect both controllers thereby minimizing the optimal benefits of two independent controllers. Furthermore, redundant controllers may frustrate optimal packaging of the motor assembly.

SUMMARY

A motor assembly in accordance with one, non-limiting, exemplary embodiment of the present invention includes a motor, an outward electronic control unit (ECU), an inward ECU, and a motor sensor board (MSB). The inward ECU is disposed between the motor and the outward ECU. The MSB unit is disposed between the motor and the inward ECU, and attached to the inward ECU.

In another, non-limiting, embodiment, a steering motor assembly includes a motor, a housing, an outward ECU, and inward ECU, a MSB, a plurality of electrical leads, and a plurality of potted seals. The housing is attached to the motor. The outward ECU is located in a first chamber defined at least in-part by the housing. The inward ECU is located in a second chamber defined, at least in-part, by the housing, and orientated between the motor and the first cavity. The MSB is located in a third chamber defined, at least in-part, by the housing, and orientated between the second cavity and the motor. The plurality of electrical leads extend between, and are electrically engaged to, the outward ECU, the inward ECU and the MSB. Each one of the plurality of potted seals are adapted to seal to a respective one of the plurality of electrical leads, and are adapted to prevent moisture migration between the first, second, and third chambers.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
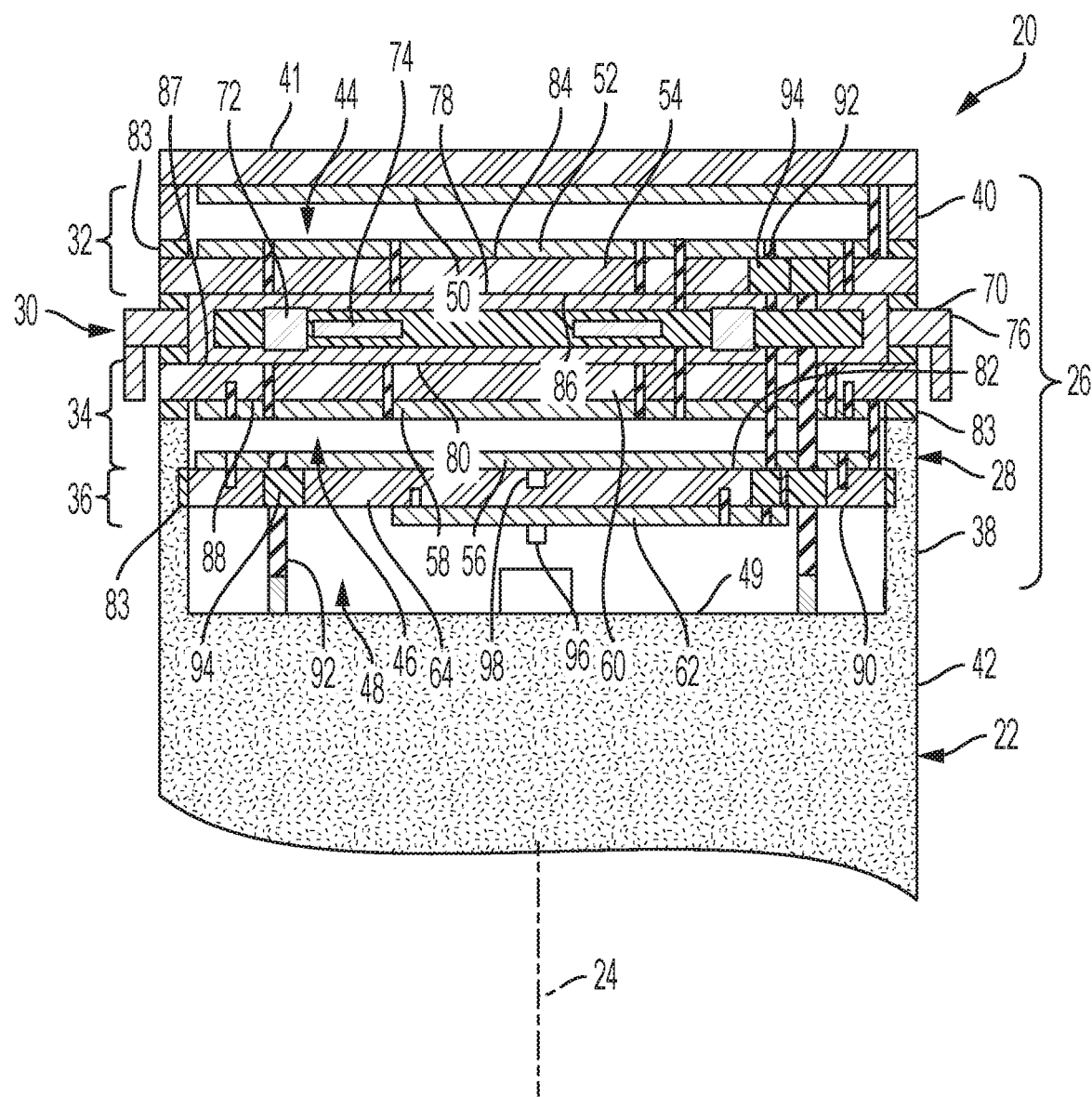
FIG. 1 is a schematic of a motor assembly.
Figure 2:
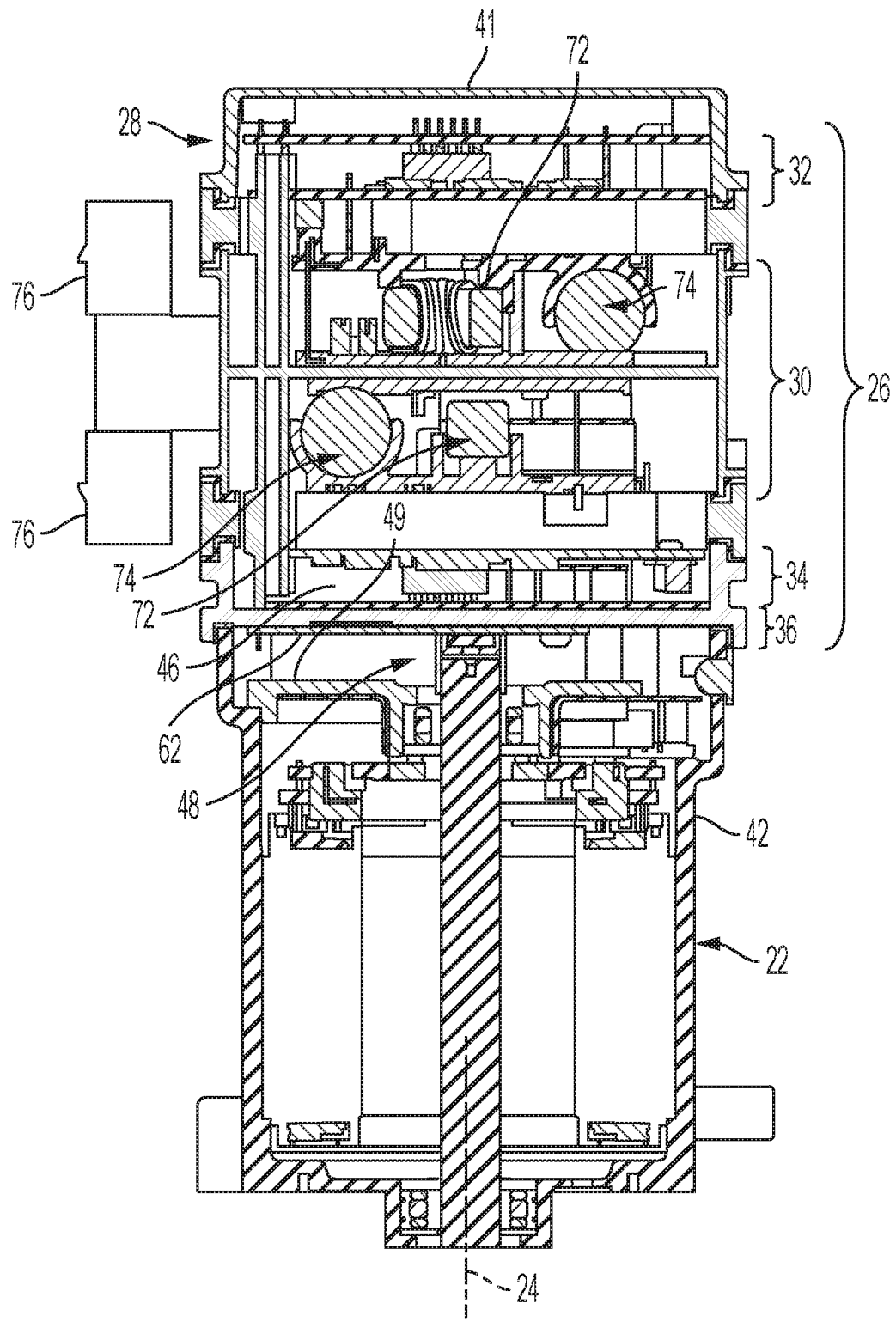
FIG. 2 is a cross section of one, non-limiting, embodiment of the motor assembly.

Referring now to the Figures, where the invention will be described with reference to specific embodiments, without limiting same, a motor assembly 20 is illustrated. The motor assembly 20 may be a steering motor assembly utilized within a vehicle that may be of manually driven and/or of an autonomously type. For example, the motor assembly 20 may be a steering assist motor assembly configured to assist a driver by controlling, or manipulating, steering torque. Referring to FIGS. 1 and 2, the motor assembly 20 includes a motor 22 that may be an electric motor including a rotor (not shown) adapted to rotate about an axis 24, and a control assembly 26. In one embodiment, the control assembly 26 includes multiple components that are stacked with respect to one-another and along an axial direction with respect to axis 24.

In one embodiment, the control assembly 26 includes a housing 28, a circuit unit 30, a first electronic control unit (ECU) 32, a second ECU 34, and a motor sensor board (MSB) unit 36. The ECU 32 and the ECU 34 may be redundant ECU's, configured to operate independently with regard to motor control. That is, if one ECU should cease to operate, the other ECU is constructed to assume motor control.

The housing 28 may be a circumferentially continuous wall that extends about the axis 24, and includes an open end that is engaged to the motor 22. In one embodiment, the housing 28 may include a rim or base portion 38 that unitarily projects outward from an outer casing 42 of the motor 22. The base portion 38 may then be adapted to connect to an outward, circumferentially continuous, wall portion 40 of the housing 28, and an end portion 41 of the housing 28 may generally complete the enclosure of the entire control assembly 26. The housing 28 (i.e., base portion 38 and wall portion 40) may have substantially the same radius as the outer casing 42 of the motor 22. When the motor assembly 20 is fully assembled, the assembly may be substantially cylindrical with a substantially consistent radius to optimize packaging. Each unit 32, 34, 36, and the circuit unit 30 may be generally located within, and supported by, the housing 28, and stacked with respect to one-another.

The circuit unit 30 may include a structure 70 and any variety of circuit related components including at least one inductor 72 (i.e., two illustrated) and at least one capacitor 74 (i.e., two illustrated). The structure 70 may be electrically non-conductive, is adapted to support the inductors 72 and capacitors 74, and may further include, or form into, an external electrical connection encasement 76 for securing external electrical connections to supply communications and/or electrical power to the inductors 72, capacitors 74, ECU 32, ECU 34, MSB unit 36, and other electrical components. In another embodiment, the structure 70, or portion thereof, may be a unitary part of housing 28, or may otherwise include a portion of the housing 28.

When the control assembly 26 is fully assembled, boundaries of a first chamber 44 may be defined by the wall portion 40 of the housing 28, end portion 41, and a face 78 of the structure 70 that faces axially outward with respect to the motor 22. Boundaries of a second chamber 46 may be defined by the base portion 38 of the housing 28, an opposite face 80 of the structure 70 that faces axially inward with respect to the motor 22, and an outer side 82 carried by the heat sink 64 of the MSB unit 36. Also, boundaries of a third chamber 48 may be defined by the base portion 38 of the housing 28, the outer side 82 carried by the heat sink 64, and an axial end surface 49 of the motor 22. The second chamber 46 is axially located between the first and second chambers 44, 48, and are environmentally sealed from one-another. The ECU 32 is located in the first chamber 44, the ECU 34 is located in the second chamber 46, and the MSB unit 36 is located in the third chamber 48.

The housing 28 may be segmented in any variety of configurations, with the segments being connected during assembly. A plurality of seals 83 (e.g., room temperature vulcanizing (RTV) seals) may be located between the segments and/or portions to facilitate the environmental sealing, or isolation, of the chambers 44, 46, 48. For example, the seals 83 may reduce, or eliminate, the propagation of moisture and/or debris through the housing 28 and into the chambers 44, 46, 48.

In one embodiment, the ECU 32 includes a logic board 50, a power board 52, and a heat sink 54. The ECU 34 includes a logic board 56, a power board 58, and a heat sink 60. The MSB unit 36 may include a MSB 62 and a heat sink 64. When the motor assembly 20 is fully assembled, the logic board 50 of the ECU 32 is spaced axially outward from the power board 52 and is attached to the end portion 41 of the housing 28. The power board 52 of the ECU 32 is attached to an opposite outer surface 84 of the heat sink 54, and the outer face 78 of the circuit unit 30 may be attached to, or generally opposes, an inner surface 86 of the heat sink 54. An outer surface 87 of the heat sink 60 is attached to, or generally opposes, the inner face 80 of the circuit unit 30. An opposite inner surface 88 of the heat sink 60 is attached to the power board 58 of the ECU 34. The opposite inner side 90 of the heat sink 64 is attached to the MSB 62.

The heat sinks 54, 60, 64 may be made of aluminum, an aluminum alloy, or any other material capable of absorbing and dissipating heat out of the respective chambers 44, 46, 48. In one embodiment, one or more of the heat sinks 54, 60, 64 may be exposed outside of the housing 28 to improve dissipation of heat. In another embodiment, the housing 28 may also function as a heat sink, or a means to dissipate heat.

In another embodiment, the heat sinks 54, 60, 64 may not generally be part of the respective units 32, 34, 36. For example, the heat sink 64 may generally be the dividing structure between the chambers 46, 48, and may further include a periphery engaged to the base portion 38 of the housing 28, and sealed thereto with a circumferentially continuous seal 83. The control assembly 26 may not include the heat sinks 54, 60, or the heat sinks 54, 60 may be an integral part of the structure 70 of the circuit unit 30. In addition, or alternatively, the surface 84 of the heat sink 54 may in-part define the chamber 44, the inner surface 88 of the heat sink 60 may in-part define the chamber 46, and the inner side 90 of the heat sink 64 may in-part define the chamber 48.

The control assembly 26 may further include a plurality of electrical leads 92 that may generally extend in an axial direction with respect to axis 24 for electrically connecting any configuration of the various electrical components including one or more of the circuit unit 30, the ECU 32, the ECU 34, and the MSB 62. Any number of the plurality of electrical leads 92 may extend through, and are electrically isolated from, any one or more of the heat sinks 54, 60, 64. At least one potted seal 94 may be attached or sealed to each lead 92 and the corresponding component through which the lead 92 extends (i.e., the heat sinks 54, 60, 64 and/or structure 70) to assure that the chambers 44, 46, 48 are environmentally sealed with respect to one-another, and thus, for example, prevents any migration of moisture. In one example, the potted seal 94 may be an overmolded plastic that prevents liquid from transferring while providing electrical isolation between circuits.

The logic board 56 of the ECU 34 may include a motor sense chip 96 and the MSB 62 may include a motor sense chip 98. The motor sense chip 98 is in and may be generally exposed to the chamber 48, and the motor sense chip 96 of the ECU 34 is in close proximity to the motor sense chip 98. The interpretation of "close proximity" is understood to mean that the two chips 96, 98 are exposed to a substantially similar magnetic flux of a common magnetic field produced by the motor 22. In one example, the motor sense chips 96, 98 may be Hall sensors.

Advantages and benefits of the present disclosure include a centralized means (i.e., the circuit unit 30) of independent electrical connections (internally and externally) for each ECU 32, 34, while still facilitating electrical connections between the ECU's 32, 34. Other advantages include the environmental sealing of each chamber 44, 46, 48 to optimize reliability, and the vertical stacking of two distinct ECU's 32, 34 for ease of packaging within a vehicle application.

Figure 3:
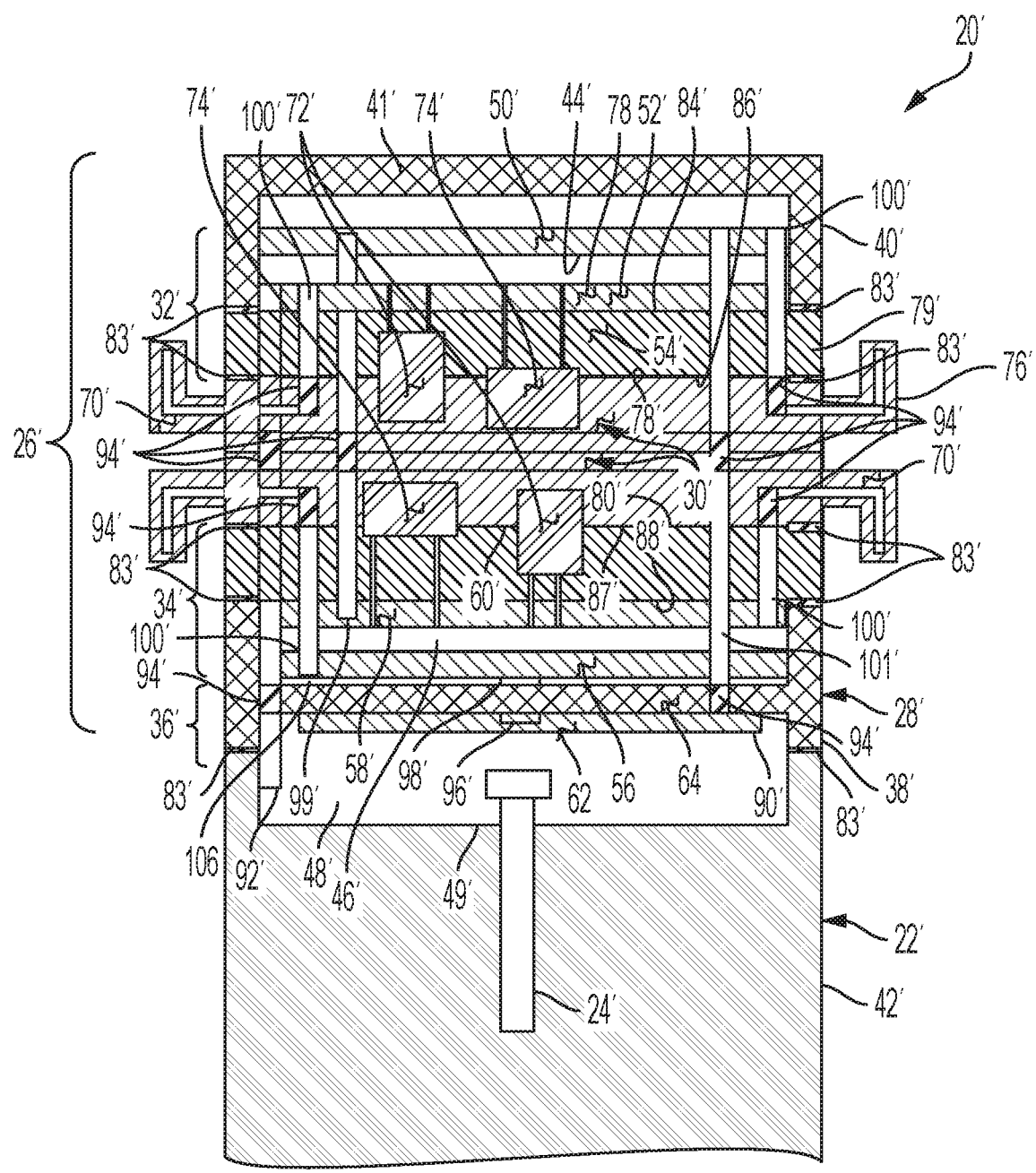
FIG. 3 is a schematic of a second embodiment of a motor assembly.

Referring to FIG. 3, a second embodiment of the present disclosure is illustrated wherein like elements to the first embodiment have like identifying numerals except for the addition of a prime symbol suffix. A motor assembly 20' includes a logic board 50' stacked and spaced between a cover 41' and a power board 52'. More specifically a first chamber 102 may be defined by, and is located between the logic board 50' and the cover 41', and a second chamber 104 is defined by, and is located between, the logic board 50' and the power board 52'. Similarly, a logic board 56' is spaced from a heat sink 64', such that a chamber 106 is defined by, and between the logic board 56' and the heat sink 64'.

Figure 4:
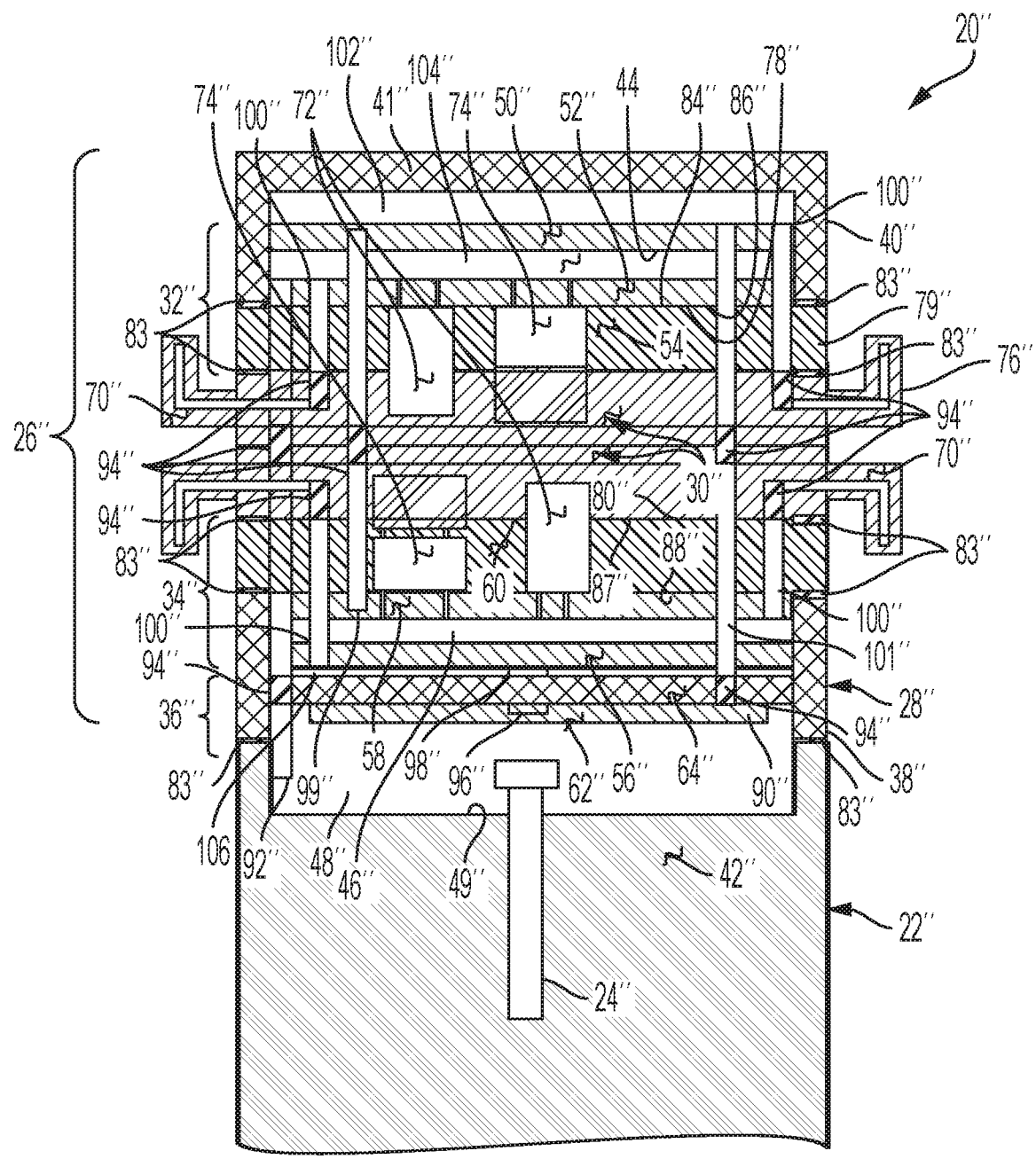
FIG. 4 is a schematic of a third embodiment of a motor assembly.

Referring to FIG. 4, a third embodiment of the present disclosure is illustrated wherein like elements to the second embodiment have like identifying numerals except for the addition, of a double prime symbol suffix. In this embodiment, inductors 72" and capacitors 74" are electrically connected and mounted directly to respective power boards 52", 58".

Terms used herein such as component, application, module, system, and the like are intended to refer to a computer-related entity, either hardware, a combination of hardware and software, or software execution. By way of example, an application may be, but is not limited to, a process running on a processor, a processor, an object, an executable, a thread of execution, a program, and/or a computer. It is understood that an application running on a server and the server, may be a component. One or more applications may reside within a process and/or thread of execution and an application may be localized on one computer and/or distributed between two or more computers.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate in scope with the present disclosure. Additionally, while various embodiments of the present disclosure have been described, it is to be understood that aspects of the present disclosure may include only some of the described embodiments or combinations of the various embodiments. Accordingly, the present disclosure is not to be seen as limited by the foregoing description.

What is claimed is:

1. A motor assembly comprising:
 a motor;
 an outward electronic control unit (ECU) including an outward logic board and an outward power board;

an inward ECU including an inward logic board and an inward power board, the inward ECU disposed between the motor and the outward ECU; and a motor sensor board (MSB) unit disposed between the motor and the inward ECU, and attached to the inward ECU.

2. The motor assembly set forth in claim 1, wherein the outward ECU includes an outward heat sink attached to the outward power board, and the inward ECU includes an inward heat sink attached to the inward power board.

3. The motor assembly set forth in claim 2, further comprising:
a circuit unit including a structure being electrically non-conductive, and disposed between and attached to the outward heat sink and the inward heat sink, the structure including at least one electrical connector encasement.

4. The motor assembly set forth in claim 3, wherein the MSB unit includes a MSB and a heat sink.

5. The motor assembly set forth in claim 4, wherein the MSB is exposed in a chamber located between and defined at least in-part by the motor and the heat sink, and the MSB is attached to the heat sink of the MSB unit.

6. The motor assembly set forth in claim 5, wherein the MSB is spaced from the motor.

7. The motor assembly set forth in claim 5, wherein the heat sink of the MSB unit includes an inner side attached to the MSB, and an opposite outer side attached to the inward logic board.

8. The motor assembly set forth in claim 7, wherein the MSB includes a first sense chip and the inward logic board includes a second sense chip in close proximity to the first sense chip for exposure to a similar magnetic flux.

9. The motor assembly set forth in claim 8, wherein the first and second sense chips are Hall sensors.

10. The motor assembly set forth in claim 3, wherein the circuit unit includes a at least one inductor supported by the structure, and at least one capacitor supported by the structure.

11. The motor assembly set forth in claim 2, further comprising:
a plurality of electrical leads configured to electrically interconnect the inward ECU, the outward ECU and the MSB, wherein the plurality of electrical leads are electrically isolated from and selectably extend through the outward heat sink, the inward heat sink, and the heat sink of the MSB unit.

12. The motor assembly set forth in claim 3, wherein the outward ECU, the circuit unit, the inward ECU, and the MSB unit are stacked with respect to one-another.

13. The motor assembly set forth in claim 1, wherein the outward ECU and the inward ECU are redundant and configured to control the motor independently.

14. A steering motor assembly comprising:
a motor;
a housing attached to the motor;
an outward electronic control unit (ECU) located in a first chamber defined at least in-part by the housing;
an inward ECU located in a second chamber defined at least in-part by the housing and orientated between the motor and the first cavity;
a motor sensor board (MSB) located in a third chamber defined at least in-part by the housing and orientated between the second cavity and the motor;
a plurality of electrical leads extending between and electrically engaged to the outward ECU, the inward ECU and the MSB; and
a plurality of potted seals with each potted seal adapted to seal to a respective one of the plurality of electrical leads and adapted to prevent moisture migration between the first, second, and third chambers.

15. The steering motor assembly set forth in claim 14, wherein the outward ECU includes an outward logic board and an outward power board spaced from the outward logic board, and the inward ECU includes an inward logic board and an inward power board spaced from the inward logic board.

16. The steering motor assembly set forth in claim 15, further comprising:
a first heat sink defining in-part the first chamber and attached to the outward power board;
a second heat sink defining in-part the second chamber and attached to the inward power board; and
a third heat sink including an outer side defining in-part the second chamber and engaged to the inward logic board, and an opposite inner side defining in-part the third chamber and attached to the MSB.

17. The steering motor assembly set forth in claim 16, further comprising:
a circuit unit including a structure being electrically non-conductive, and disposed between and attached to the first and second heat sinks, the structure including at least one electrical connector encasement.

18. The motor assembly set forth in claim 5, wherein the MSB is spaced from the motor, the MSB includes a first sense chip, and the inward logic board includes a second sense chip in close proximity to the first sense chip to facilitate exposure to a similar magnetic flux.

19. A motor assembly comprising:
a motor;
an outward electronic control unit (ECU) including an outward power board and an outward heat sink attached to the outward power board;
an inward ECU including an inward power board and an inward heat sink attached to the inward power board, the inward ECU disposed between the motor and the outward ECU; and
a motor sensor board (MSB) unit disposed between the motor and the inward ECU, and attached to the inward ECU.

* * * * *